United States Patent
Hofmann (10) Patent No.: US 10,186,515 B2
(45) Date of Patent: Jan. 22, 2019

(54) ANTIFUSE CELL COMPRISING PROGRAM TRANSISTOR AND SELECT TRANSISTOR ARRANGED ON OPPOSITE SIDES OF SEMICONDUCTOR LAYER

(71) Applicant: Soitec, Crolles (FR)

(72) Inventor: Franz Hofmann, Munich (DE)

(73) Assignee: SOITEC, Bernin (FR)

( * ) Notice: Subject to any disclaimer, the term of this patent is extended or adjusted under 35 U.S.C. 154(b) by 43 days.

(21) Appl. No.: 14/413,405

(22) PCT Filed: Jul. 4, 2013

(86) PCT No.: PCT/EP2013/064138
§ 371 (c)(1),
(2) Date: Jan. 7, 2015

(87) PCT Pub. No.: WO2014/009247
PCT Pub. Date: Jan. 16, 2014

(65) Prior Publication Data
US 2015/0171094 A1    Jun. 18, 2015

(30) Foreign Application Priority Data
Jul. 10, 2012 (FR) .................... 12 56636

(51) Int. Cl.
*H01L 27/11* (2006.01)
*H01L 21/70* (2006.01)
(Continued)

(52) U.S. Cl.
CPC ........ *H01L 27/11206* (2013.01); *G11C 17/16* (2013.01); *H01L 27/101* (2013.01);
(Continued)

(58) Field of Classification Search
CPC ......... H01L 23/5252; H01L 2924/0002; H01L 2924/00; H01L 27/101; H01L 27/11206;
(Continued)

(56) References Cited

U.S. PATENT DOCUMENTS 6,043,536 A    3/2000 Numata et al.
7,157,782 B1   1/2007 Shih et al.
(Continued)

FOREIGN PATENT DOCUMENTS

EP    1389782 A1    2/2004

OTHER PUBLICATIONS

Hong, Linh, Comparison of embedded non-volatile memory technologies and their applications, Kilopass, www.Kilopass.com, (May 2009), 8 pages.
(Continued)

*Primary Examiner* — Duy T Nguyen
(74) *Attorney, Agent, or Firm* — TraskBritt (57) ABSTRACT

The disclosure relates to a semiconductor structure comprising: a first semiconductor layer, a first program transistor, and a first select transistor implementing a first antifuse cell, wherein the first semiconductor layer acts as the body of the first program transistor and as the body of the first select transistor, wherein a gate of the first program transistor and a gate of the first select transistor are on different sides of the first semiconductor layer.

13 Claims, 5 Drawing Sheets

(51) Int. Cl.
*H01L 27/112* (2006.01)
*G11C 17/16* (2006.01)
*H01L 27/10* (2006.01)
*H01L 27/12* (2006.01)
*H01L 23/525* (2006.01)

(52) U.S. Cl.
CPC .... *H01L 27/11286* (2013.01); *H01L 27/1203* (2013.01); *H01L 23/5252* (2013.01); *H01L 2924/0002* (2013.01)

(58) Field of Classification Search
CPC .............. H01L 27/11286; H01L 27/1203; G11C 17/16
USPC ............. 257/50, 530, E23.147; 438/131
See application file for complete search history.

(56) References Cited

U.S. PATENT DOCUMENTS

| | | | |
|---|---|---|---|
| 2004/0206996 A1* | 10/2004 | Lee | G11C 16/3427 257/296 |
| 2004/0227260 A1* | 11/2004 | Fukuzumi | H01L 21/76229 257/797 |
| 2005/0073023 A1 | 4/2005 | Fifield et al. | |
| 2006/0234428 A1 | 10/2006 | Furukawa et al. | |
| 2006/0284236 A1* | 12/2006 | Bhattacharyya | B82Y 10/00 257/314 |
| 2008/0083943 A1* | 4/2008 | Walker | G11C 16/3418 257/315 |
| 2009/0256624 A1 | 10/2009 | Kim et al. | |
| 2010/0140679 A1* | 6/2010 | Walker | H01L 27/0688 257/316 |
| 2010/0207190 A1* | 8/2010 | Katsumata | G11C 16/0483 257/319 |
| 2010/0232203 A1* | 9/2010 | Chung et al. | 365/96 |
| 2010/0289064 A1* | 11/2010 | Or-Bach et al. | 257/209 |
| 2011/0031582 A1 | 2/2011 | Booth, Jr. et al. | |
| 2011/0103127 A1* | 5/2011 | Kurjanowicz | G11C 17/16 365/96 |
| 2013/0051112 A1 | 2/2013 | Xia et al. | |
| 2014/0015095 A1* | 1/2014 | Hui | H01L 27/101 257/530 |

OTHER PUBLICATIONS

International Search Report for International Application No. PCT/EP2013/064138 dated Jul. 23, 2013, 4 pages.
International Preliminary Report on Patentability for International Application No. PCT/EP2013/064138, dated Jan. 13, 2015, 6 pages.
International Written Opinion for International Application No. PCT/EP2013/064138, dated Jul. 15, 2013, 5 pages.
Chinese Office Action for Chinese Application No. 201380036999.9, dated Oct. 25, 2016, 11 pages.
Chinese Office Action for Chinese Application No. 201380036999.9, dated Jul. 5, 2017, 7 pages.
Chinese Third Office Action for Chinese Application No. 201380036999.9, dated Jan. 8, 2018, 6 pages.

* cited by examiner

(PRIOR ART)

Fig. 5B

(PRIOR ART)

ANTIFUSE CELL COMPRISING PROGRAM TRANSISTOR AND SELECT TRANSISTOR ARRANGED ON OPPOSITE SIDES OF SEMICONDUCTOR LAYER

CROSS-REFERENCE TO RELATED APPLICATIONS

This application is a national phase entry under 35 U.S.C. § 371 of International Patent Application PCT/EP2013/064138, filed Jul. 4, 2013, designating the United States of America and published in English as International Patent Publication WO 2014/009247 A1 on Jan. 16, 2014, which claims the benefit under Article 8 of the Patent Cooperation Treaty and under 35 U.S.C. § 119(e) to French Patent Application Serial No. 1256636, filed Jul. 10, 2012, the disclosure of each of which is hereby incorporated herein in its entirety by this reference.

TECHNICAL FIELD

This disclosure relates to the field of electronics and, in particular, to the field of semiconductors. More specifically, it relates to the field of antifuses. Even more specifically, the disclosure relates to a semiconductor structure, comprising a first semiconductor layer, a first program transistor and a first select transistor implementing a first antifuse cell, wherein the first semiconductor layer acts as the body of the first program transistor and as the body of the first select transistor.

BACKGROUND

Antifuse cells are popular in the field of semiconductors, where they are often used as an implementation of a one-time programmable cell. For instance, they can be used for purposes such as recording of secret codes, production numbers, etc. In particular, an antifuse cell is a structure that can be used to record a digital value, such as 0 or 1, by creating, or not, an electrical connection between two electrodes. More specifically, by applying a high voltage between the two electrodes, a layer of insulator is broken and connection between the electrodes is achieved. Antifuse cells are, therefore, typically write-once memories.

Figure 5A:
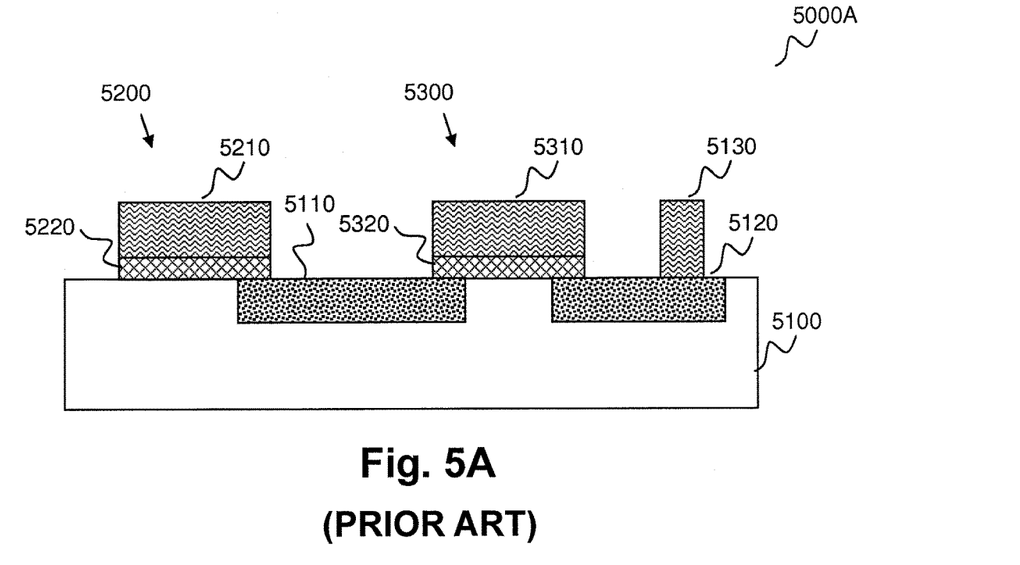
FIGS. 5A and 5B schematically illustrate antifuse cells in accordance with the state of the art.

FIG. 5A illustrates an antifuse cell 5000A in accordance with the state of the art. Such cell is described, for instance, in non-patent literature "Comparison of embedded non-volatile memory technologies and their applications," Linh Hong, Kilopass (retrieved from the from the World Wide Web at kilopass.com).

More specifically, the antifuse cell 5000A comprises a semiconductor substrate 5100 on which two transistors 5200, 5300 are realized: a program transistor 5200 comprising gate 5210 and gate oxide 5220, and a select transistor 5300 comprising gate 5310 and gate oxide 5320. The two transistors 5200 and 5300 are connected in series via a first connection region 5110. The other end of select transistor 5300 is connected to a second connection region 5120, which is then connected to a connection 5130.

The programming of the antifuse cell 5000A is carried out in the following manner. Contact 5130 is at a positive voltage and transistor 5300 is in an "on" state. When a high voltage is applied on the program transistor 5200, the oxide 5220 below the gate 5210 will break and a permanent electrical connection will be realized between the gate 5210 and the first connection region 5110. In this manner, if the high voltage is applied, a digital value of, for instance, 1 is recorded. Conversely, if the high voltage is not applied, a digital value of, for instance, 0 is recorded.

The reading of the antifuse cell 5000A is carried out by opening the select transistor 5300 with the application of the required voltage on its gate 5310. In this manner, the first connection region 5110 is connected to the second connection region 5120 and to the connection 5130. Therefore, by applying a voltage between the gate 5210 and the connection 5130, it is possible to detect the value stored in the antifuse cell 5000. In particular, with reference to the example above, if a current is flowing between the gate 5210 and the connection 5130, then a digital value of 1 is read. If no current is flowing, then a digital value of 0 is read.

This implementation requires the usage of two transistors next to each other, as well as the presence of several connection regions, which take up a considerable area on the semiconductor substrate 5100.

Figure 5B:
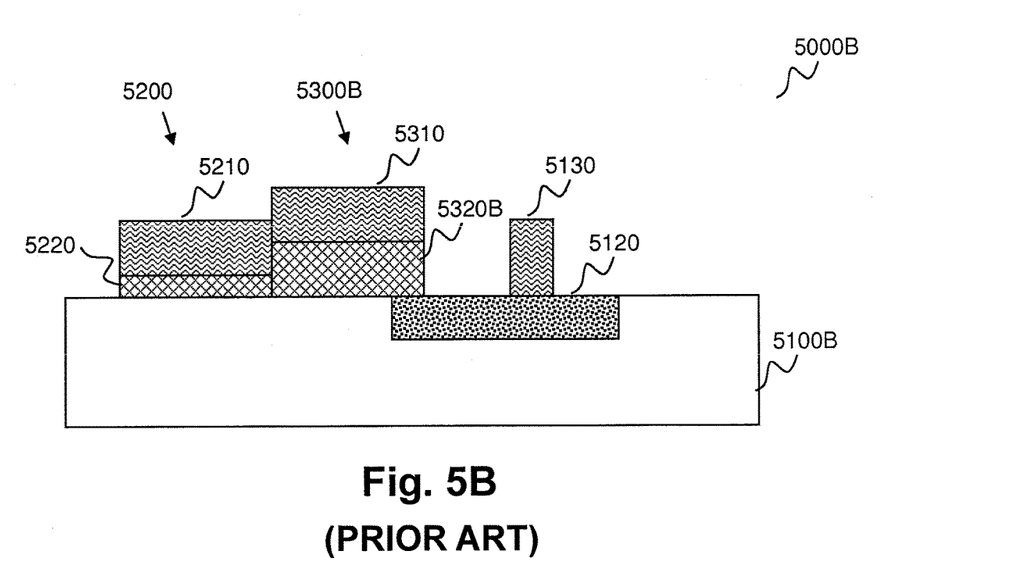

FIG. 5B illustrates an alternative antifuse cell 5000B in accordance with the state of the art.

Antifuse cell 5000B is advantageous over antifuse cell 5000A in that it does not require a first connection region 5110. More specifically, semiconductor substrate 5100B comprises only one connection region, namely second connection region 5120. This is achieved by realizing transistors 5200 and 5300 next to each other, such that they do not need a connection region in between.

However, such arrangement means that the high voltage used during the programming phase will be applied to both gates 5210 and 5310. This would result in the oxide below the select transistor 5300 to be damaged too. In order to solve this problem, the select transistor 5300 is replaced by select transistor 5300B, which is provided with a gate oxide 5320B thicker than the gate oxide 5220 of the program transistor 5200.

While this solution reduces the area by eliminating the need for first connection region 5110, it requires the usage of two different gate oxide thicknesses. This usually results in the problem that the select transistor 5300B, having the thicker gate oxide, cannot be realized with the minimum feature pitch, thereby becoming bigger than select transistor 5300, which increases again the area used by antifuse cell 5000. Additionally, the presence of two different gate oxides requires one additional mask as well as some manufacturing steps, increasing costs.

BRIEF SUMMARY

This disclosure has been realized with the aim of solving the above-mentioned problems.

In particular the disclosure can relate to a semiconductor structure, comprising: a first semiconductor layer, a first program transistor and a first select transistor implementing a first antifuse cell, wherein the first semiconductor layer acts as the body of the first program transistor and as the body of the first select transistor; wherein a gate of the first program transistor and a gate of the first select transistor are on different sides of the first semiconductor layer.

Thanks to such approach, it is possible to place the program transistor in series with the select transistor without a first connection region 5110, such as in FIG. 5A, and without the usage of two oxide thicknesses such as in FIG. 5B.

In some embodiments, the semiconductor structure can be a multi-gate semiconductor structure, and the gate of the first program transistor and the gate of the first select transistor are, respectively, a back gate and a top gate, or vice versa, of the multi-gate semiconductor structure.

Thanks to such approach, the realization of the semiconductor structure can be carried out with standard technology such as SOI, Finfets, etc.

In some embodiments, the semiconductor structure can further comprise at least one second program transistor implementing a second antifuse cell in combination with the first select transistor, wherein the first program transistor is connected in parallel with the at least one second program transistor.

Thanks to such approach, two antifuse cells can share a single select transistor and a single connection to both program transistors, thereby reducing the number of contacts necessary to operate the structure.

In some embodiments, the semiconductor structure can further comprise at least one third program transistor implementing a third antifuse cell in combination with the first select transistor, wherein the first program transistor is connected in series with the at least one third program transistor.

Thanks to such approach, it is possible to place the third and first program transistors next to each other, instead of separating them via a shared common output connection. This is advantageous since manufacturing design rules may allow a narrower pitch of the structure comprising two program transistors next to a connection, rather than a program transistor followed by a connection and a subsequent program transistor.

In some embodiments, the gate and gate oxide of any of the program transistors can be shaped such that the electric field of the gate is concentrated on a point or a line of the gate oxide.

Thanks to such approach, a lower programming voltage can be used in order to break the gate oxide.

In some embodiments, the first semiconductor layer comprises an etched region, the gate oxide can be placed on the first semiconductor layer and at least on a portion of the wall of the etched region, and the gate can be placed on the gate oxide, so as to realize an angle in correspondence with the etched region.

Thanks to such approach, it is possible to realize the shape of the gate and gate oxide such that the electric field of the gate is concentrated on a point of the gate oxide in a simple and effective manner.

BRIEF DESCRIPTION OF THE DRAWINGS

The disclosure will be described in more detail by way of example hereinafter using advantageous embodiments and with reference to the drawings. The described embodiments are only possible configurations in which the individual features may, however, as described above, be implemented independently of each other or may be omitted. Equal elements illustrated in the drawings are provided with equal reference signs. Parts of the description relating to equal elements illustrated in the different drawings may be left out. In the drawings.

DETAILED DESCRIPTION

A first embodiment of the disclosure will now be described with reference to cross-sectional view of FIG. 1A.

The antifuse cell 1000A mainly differs from the antifuse cell 5000A due to the fact that the select transistor 5300 is not realized on the same surface of the semiconductor substrate as the program transistor 5200. On the other hand, a select transistor 1300 of antifuse cell 1000A is realized on the opposite side of the semiconductor substrate 1100A.

In particular, semiconductor substrate 1100A comprises a first semiconductor layer 1140, for instance silicon, a bulk semiconductor layer 1160, for instance silicon, and an insulating layer 1150, for instance silicon oxide, in between. In some embodiments, the bulk semiconductor layer 1160 can be made conductive, while in some embodiments, only a part 1161 of bulk semiconductor layer 1160 can be doped so as to be conductive. The semiconductor substrate 1100A may, e.g., be obtained by a SMARTCUT® process. More specifically, this implies providing the semiconductor structure by forming a first intermediate insulating layer above the bulk semiconductor layer 1160, forming a second intermediate insulation layer above a second semiconductor substrate, bonding the first and the second intermediate insulation layers, thereby obtaining the insulating layer 1150, within a wafer transfer process and removing part of the second semiconductor substrate, thereby obtaining the first semiconductor layer 1140.

As a result of such arrangement, it is possible to realize select transistor 1300 by using the bulk semiconductor 1160 as gate, the insulating layer 1150 as a breakdown layer, and the first semiconductor layer 1140 as body 1301. In particular, the body 1301 can be easily realized by leaving a space between the body of the program transistor 5200 and the connection region 5120. In this manner, the lateral dimensions of the antifuse cell 1000A can be reduced when compared to the state of the art antifuse cells 5000A and 5000B.

Although in this embodiment the gates/transistors are placed on "opposite sides," the disclosure is not limited thereto and can more generally be implemented as long as the gates/transistors are "not on the same side" of the common body they share. For instance, as illustrated in FIG. 1A, gate 5210 can be on an upper surface of the first semiconductor layer 1140, while gate 1160 or 1161 can be on a lower surface of the first semiconductor layer 1140. A similar approach though could be realized in a technology employing vertical gates, one being placed on the right side of a semiconductor layer acting as a body and one being placed on the left side of the same semiconductor layer. Even more generally, although not illustrated in the figures, the two transistors could be realized on different sides of the first semiconductor layer 1140, not necessarily opposite to each other. For instance, gate 5210 can be on an upper surface of the first semiconductor layer 1140, as illustrated in FIG. 1A, while gate 1160 or 1161 can be on a surface of the first semiconductor layer 1140 parallel to the cutting plane along which FIG. 1A is taken, or perpendicular to this plane and perpendicular as well to the plane of gate 5210. In other words, a gate could be on a horizontal surface of the first semiconductor layer 1140 while the other gate could be on a vertical surface of the first semiconductor layer 1140. All these approaches are advantageous, since they combine the two transistors on different sides of the first semiconductor layer 1140, such that the area they occupy on the wafer is reduced, compared to the case in which the two transistors are on the same side of the first semiconductor layer 1140.

Figure 1A:
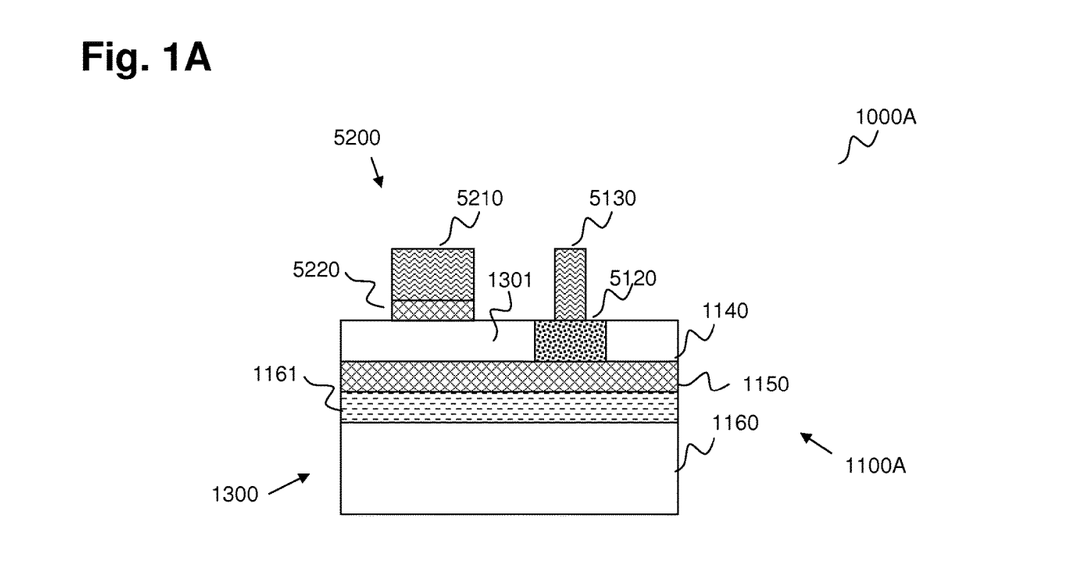
FIG. 1A schematically illustrates an antifuse cell 1000A in accordance with an embodiment of the disclosure.
Figure 1B:
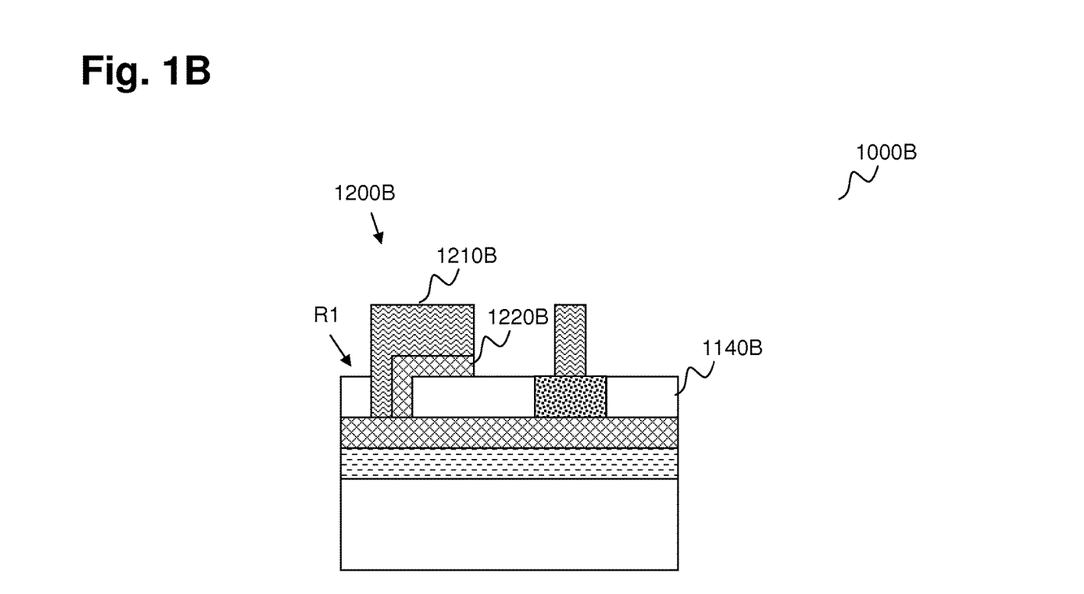
FIG. 1B schematically illustrates an antifuse cell 1000B in accordance with an embodiment of the disclosure.

FIG. 1B schematically illustrates a cross-sectional view of a further embodiment of the disclosure. In particular, FIG. 1B illustrates an antifuse cell 1000B based on the antifuse cell 1000A of FIG. 1A in which the first semiconductor layer 1140B is etched in a region R1 such that the gate oxide 1220B, which acts as a breakdown layer, and the gate 1210B of program transistor 1200B have an angle in correspondence with region R1. This locally increases, in correspondence with the angle, the electric field generated by applying a voltage on the gate 1210B, which makes it easier to break the gate oxide 1220B, thereby resulting in the application of lower voltage requirements during the programming of antifuse cell 1000B compared to the programming of antifuse cell 1000A.

Although the illustrated embodiment provides a 90° angle, the disclosure is not limited thereto and any arrangement that increases the electric field in a certain region of the gate oxide 1120B can be used instead. Additionally, although the embodiment illustrates both the gate oxide and the gate reaching the insulating layer 1150, the disclosure is not limited thereto. Alternatively, or in addition, the gate can be shaped so as to only reach an intermediate depth of the first semiconductor layer 1140B.

Figure 2A:
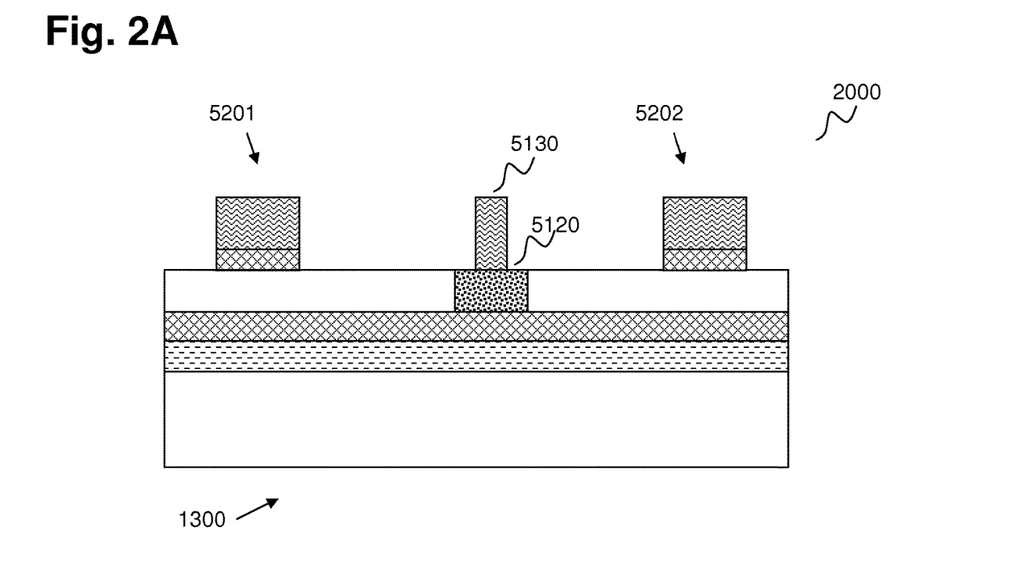
FIGS. 2A and 2B schematically illustrate a NOR antifuse cell arrangement 2000 in accordance with an embodiment of the disclosure.
Figure 2B:
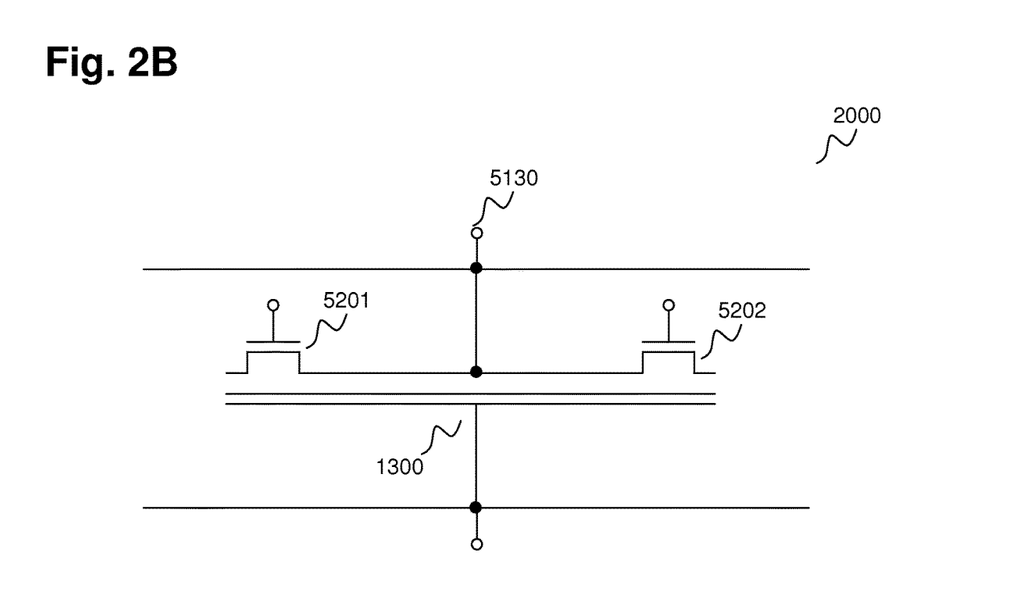

FIG. 2A schematically illustrates a vertical cut view of a physical implementation of a NOR antifuse cell arrangement in accordance with an embodiment of the disclosure. FIG. 2B illustrates the corresponding electrical scheme.

More specifically, the NOR antifuse cell arrangement 2000 comprises two program transistors 5201 and 5202 and one select transistor 1300. The two program transistors are connected each to one side of connection region 5120. Accordingly, when a voltage is applied on the gate of select transistor 1300, corresponding to the bulk semiconductor layer 1160, so as to make the transistor conducting, current can flow to the connection 5130 via the first program transistor 5201 and/or via the second program transistor 5202, depending on how each of the two program transistors has been programmed. Therefore, the resulting functionality of the structure is a NOR function of the programming of the two program transistors 5201 and 5202. This provides the advantage that only one select transistor can be used for two program transistors.

Figure 3A:
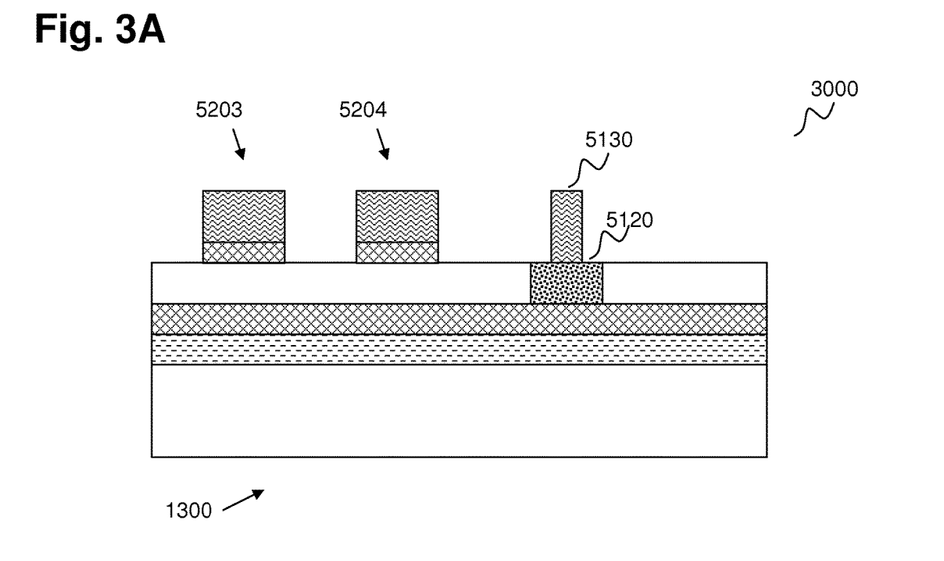
FIGS. 3A and 3B schematically illustrate a NAND antifuse cell arrangement 3000 in accordance with an embodiment of the disclosure.
Figure 3B:
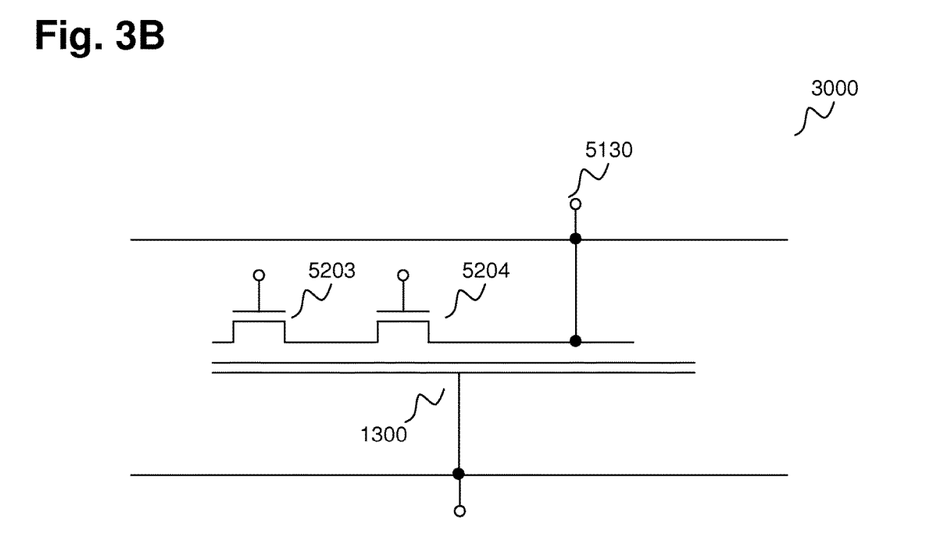

FIG. 3A schematically illustrates a cross-sectional view of a physical implementation of a NAND antifuse cell arrangement in accordance with an embodiment of the disclosure. FIG. 3B illustrates the corresponding electrical scheme.

More specifically, the NAND antifuse cell arrangement 3000 comprises two program transistors 5203 and 5204 and one select transistor 1300. The two program transistors are placed next to each other and connected in series while the other end of program transistor 5204 is connected to second connection region 5120. Accordingly, when a voltage is applied on the gate of select transistor 1300 corresponding to the bulk semiconductor layer 1160 so as to make the transistor conducting, current can flow to the connection 5130 via the first program transistor 5201 and/or via the second program transistor 5202, depending on how each of the two program transistors has been programmed. Therefore, the resulting functionality of the structure is a NAND function of the programming of the two program transistors 5201 and 5202. In particular, any number of program transistors is possible. These transistors are in series to the contact 5130.

In an exemplary programming method, select transistor 1300 is conducting, so an inversion layer is created in the layer 1301. Gate 5204 is floating and gate 5203 is at a high voltage. Due to the inversion layer, a high electric field is present between regions 5203 and 1301. In the area below gate 5203, the break of oxide 5220, which acts as a breakdown layer, will occur. During a first reading operation, select transistor 1300 is selected on, gate 5204 is floating and gate 5203 is at an on voltage, so a current flows from 5203 to 5130 via the inversion layer. During a second reading operation, select transistor 1300 is selected on and gate 5203 is floating. On gate 5204, an on voltage is applied. Since the gate oxide 5220 was not broken, no current flows from 5204 to 5130.

Although this embodiment has been illustrated with only two program transistors 5203 and 5204, the disclosure is not limited thereto. Alternatively, or in addition, several other program transistors could be realized, all connected in series to program transistors 5203 and 5204. Still alternatively, or in addition, in all embodiments, several other program transistors could be realized in planes crossing the plane of the cut view of FIG. 3A. For instance, in a perpendicular plane to the one of FIG. 3A, one or two additional program transistors could be connected in a manner similar to that illustrated in FIG. 3A. In all of those cases, a single select transistor may be used for some or all of the program transistors.

This is advantageous compared to the state of the art antifuse, where a series array could not be used, as each storage element needed its own select transistor. Additionally, since any number of transistors can be placed in series, the NAND arrangement for a larger number of transistors consumes less area than the NOR arrangement.

Figure 4A:
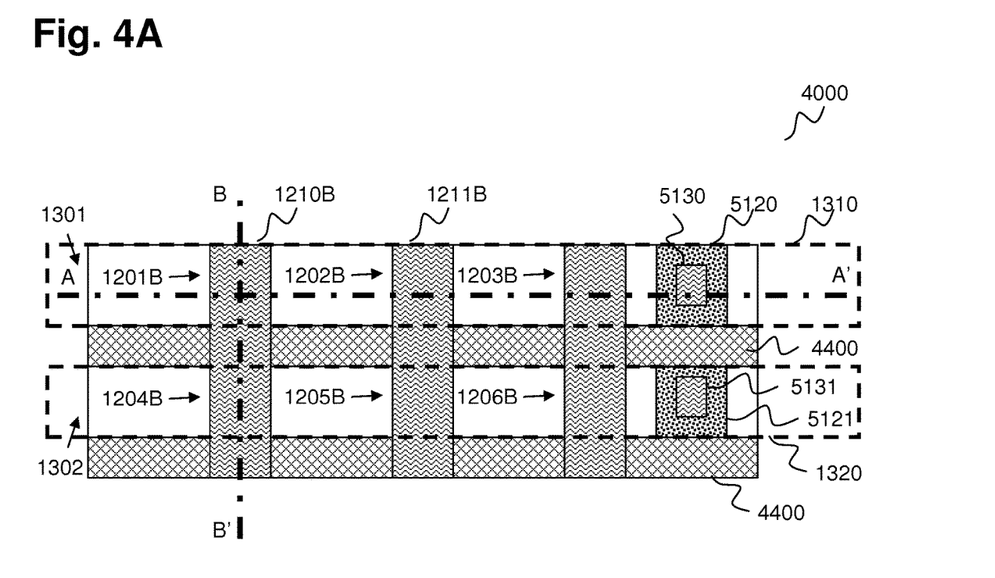
FIGS. 4A and 4B schematically illustrate a further NAND antifuse cell arrangement 4000 in accordance with an embodiment of the disclosure.
Figure 4B:
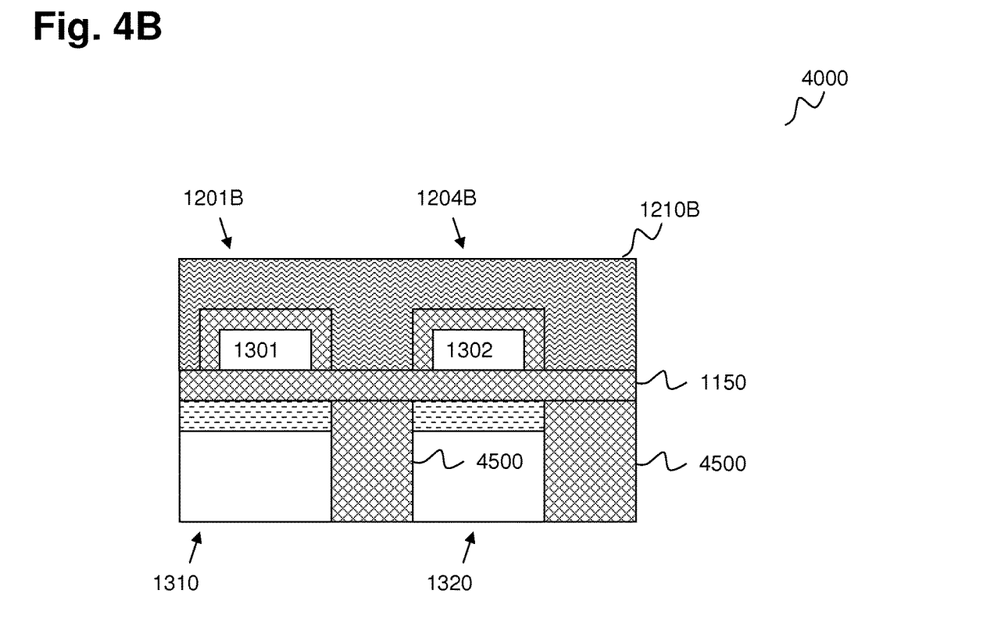

FIGS. 4A and 4B illustrate a further antifuse cell arrangement 4000 in accordance with an embodiment of the disclosure. In particular, while in the previous embodiments the cross-sectional views were taken along direction A-A' of FIG. 4A, FIG. 4B is a cross-sectional view of FIG. 4A taken along direction B-B'.

More specifically, in FIGS. 4A and 4B, antifuse cell arrangement 4000 comprises six program transistors 1201B-1206B and two select transistors 1310-1320, separated by trench insulation lines 4500. Program transistors 1201B-1203B are associated, i.e., overlapping with, select transistor 1310. Program transistors 1204B-1206B are associated, i.e., overlapping with, select transistor 1320. As can be seen in the figure, the antifuse cell can be organized in such a manner that vertical adjacent program transistors, i.e., 1201B and 1204B are separated by a trench insulation 4400. This provides the beneficial advantage that a single select transistor 1310 can be used for a plurality of program transistors.

In this specific embodiment, the programming could be done by applying a high voltage on a given gate, i.e., 1210B, and a lower voltage on connection 5130. If the silicon 1301 has an inversion layer, which is also connected to connection 5130 to a fixed voltage, the high voltage difference will break the gate oxide 1220B of program transistor 1201B. Similarly, by applying a high voltage on gate 1211B and a lower voltage on connection 5131 while program transistor 1302 is conducting, the voltage difference will break the gate oxide 1220B of program transistor 1205B.

While only two rows are here illustrated, it will be clear to those skilled in the art that several rows can be implemented.

Moreover, the embodiment of FIGS. 4A and 4B could also be realized with some of the program transistors being the program transistors 1200B described by the embodiment of FIG. 1B and some of the program transistors being the program transistors 5200 described by the embodiment of FIG. 1A. Still further, the parallel placement of rows of program transistors 1201B-1203B and 1204B-1206B could also be similar if some or all of the rows are arranged in a NAND arrangement 3000 according to the embodiment of FIGS. 3A and 3B or arranged in a NOR arrangement 2000 according to the embodiment of FIGS. 2A and 2B.

More generally, although the embodiments of FIGS. 2A and 3A have been illustrated as being realized with a programming transistor 5200, the disclosure is not limited thereto. Alternatively, or in addition, they can also be implemented with one or more programming transistors 1200B.

Further, although the embodiments described above have been illustrated with the gate of the select transistor being realized by the entire bulk semiconductor layer 1160, the disclosure is not limited thereto. In particular, the bulk semiconductor layer could be structured in such a manner so as to realize a plurality of independent gates, for a plurality of select transistors, each overlapping with one or more program transistors.

Additionally, although the embodiments have been illustrated with reference to a silicon on insulator structure, the disclosure can be realized with any technology that allows the realization of a first transistor gate on one side of a semiconductor layer, acting as body, and of a second transistor gate on a second side of the semiconductor layer, in particular, on the side opposite to the one on which the first gate is realized.

Additionally, although the embodiments have been illustrated with the select transistor being realized as a "back-gate transistor" with the insulating layer 1150 and the bulk semiconductor layer 1160, while the program transistor is realized as a "top-gate transistor" with a gate 5210 and a gate oxide 5220, the disclosure is not limited thereto. Alternatively, or in addition, the two transistors could be switched. That is, the program transistor could be realized as a "back-gate transistor" with the insulating layer 1150 and the bulk semiconductor layer 1160, while the select transistor could be realized as a "top-gate transistor" with a gate 5210 and a gate oxide 5220.

The invention claimed is:

1. An anti-fuse cell, comprising:
a first semiconductor layer comprising a single connection region;
a breakdown layer located on the first semiconductor layer, wherein the breakdown layer exhibits a first electrical conductivity prior to an electrical breakdown and a second electrical conductivity after the electrical breakdown;
a first program transistor having a program gate and a body comprising the first semiconductor layer; and
a first select transistor having a select gate and a body comprising the first semiconductor layer;
wherein the program transistor is in series with the first select transistor; and
wherein the program gate and the select gate are arranged on opposite sides of the first semiconductor layer and the breakdown layer.

2. The anti-fuse cell of claim 1, wherein:
the first semiconductor layer comprises a first portion and a second portion separated by the connection region;
the program gate of the first program transistor is located on the first portion of the first semiconductor layer;
a program gate of a second program transistor of a second anti-fuse cell is located on the second portion of the first semiconductor layer; and
the first program transistor is connected in parallel to the second program transistor.

3. The anti-fuse cell of claim 2, wherein the first program transistor is connected in series with a third program transistor of a third anti-fuse cell, wherein a program gate of the third program transistor is located on the first portion of the first semiconductor layer.

4. The anti-fuse cell of claim 3, wherein the program gate and a gate oxide of any of the first program transistor, second program transistor, and third program transistor are shaped such that the electric field of the program gate is concentrated on a point or a line of the gate oxide.

5. The anti-fuse cell of claim 4, wherein the first semiconductor layer comprises an etched region and for any of the first program transistor, the second program transistor, and the third program transistor:
the gate oxide is placed on the first semiconductor layer and at least on a portion of a wall of the etched region; and
the program gate is placed on the gate oxide, so as to realize an angle in correspondence of the etched region.

6. The anti-fuse cell of claim 4, wherein the second anti-fuse cell and the third anti-fuse cell share the first select transistor.

7. The anti-fuse cell of claim 1, wherein the program gate and a gate oxide of the first program transistor are shaped such that the electric field of the gate is concentrated on a point or a line of the gate oxide.

8. The anti-fuse cell of claim 7, wherein the first semiconductor layer comprises an etched region and for the first program transistor:
the gate oxide is placed on the first semiconductor layer and at least on a portion of a wall of the etched region; and
the program gate is placed on the gate oxide, so as to realize an angle in correspondence of the etched region.

9. The anti-fuse cell of claim 1, further comprising a second program transistor, and wherein the first program transistor, the second program transistor, and the first select transistor are arranged in a NOR configuration.

10. The anti-fuse cell of claim 1, further comprising a second program transistor, and wherein the first program transistor, the second program transistor, and the first select transistor are arranged in a NAND configuration.

11. The anti-fuse cell of claim 1, wherein the breakdown layer comprises an insulation layer between the select gate and the first semiconductor layer.

12. The anti-fuse cell of claim 1, wherein the single connection region facilitates current flow from the program gate, through the first semiconductor layer to a contact on the single connection region upon applying a voltage to the program gate.

13. The anti-fuse cell of claim 1, wherein the single connection region is arranged to facilitate current flow from the select gate, through the program transistor after electrical breakdown, and to a contact on the single connection region upon application of a voltage at the select gate.

* * * * *